United States Patent
Yokokura et al.

(10) Patent No.: US 6,476,582 B2
(45) Date of Patent: Nov. 5, 2002

(54) BATTERY POWER SUPPLY APPARATUS

(75) Inventors: Saburo Yokokura, Hachiouji; Munecazu Tacano, Tsuchiura; Toshiaki Matsui, Koganei, all of (JP)

(73) Assignee: Communications Research Laboratory, Independent Administrative Institution, Koganei (JP)

( * ) Notice: Subject to any disclaimer, the term of this patent is extended or adjusted under 35 U.S.C. 154(b) by 0 days.

(21) Appl. No.: 09/964,457

(22) Filed: Sep. 28, 2001

(65) Prior Publication Data

US 2002/0130636 A1 Sep. 19, 2002

(30) Foreign Application Priority Data

Mar. 19, 2001 (JP) .......................................... 2001-077542

(51) Int. Cl.$^7$ ............................................... H01M 10/46
(52) U.S. Cl. ........................................ 320/116; 320/120
(58) Field of Search ................................... 320/110, 112, 320/116, 118, 120, 125, 127, 137

(56) References Cited

U.S. PATENT DOCUMENTS

| | | | |
|---|---|---|---|
| 4,560,937 A | * 12/1985 | Finger |
| 4,684,872 A | * 8/1987 | Stewart |
| 4,709,202 A | * 11/1987 | Koenck et al. |
| 5,422,558 A | 6/1995 | Stewart |
| 5,563,517 A | 10/1996 | Biery et al. |
| 5,698,971 A | * 12/1997 | Sahai et al. |
| 5,939,861 A | * 8/1999 | Joko et al. |

OTHER PUBLICATIONS

Baracchino, L. et al., "Ultralow–Noise Programmable Voltage Source", IEEE Trans. Instrum. Meas., vol. 46, Dec. 1997, pp. 1256–1261.

"Fiber–Optics General–Purpose Interface Bus Extender", IBM Technical Disclosure Bulletin, IBM Corp. New York, USA, vol. 31, No. 2, Jul. 1, 1988, pp. 253–254.

* cited by examiner

Primary Examiner—Edward H. Tso
(74) Attorney, Agent, or Firm—Oblon, Spivak, McClelland, Maier & Neustadt, P.C.

(57) ABSTRACT

In a battery power supply apparatus for low-noise measurement systems or ultra high-sensitivity sensor elements (ultra-sensitive light or microwave sensors, or SQUID, SIS/SNS or other Josephson effect devices, etc.), the power supply device that supplies power to the outside and the control device that controls the power supply device perform bidirectional communications by means of an optical communications circuit, and thus it is possible to prevent noise arising in the control device from reaching the power supply device. In addition, it is possible to prevent the introduction of noise from the optical communications circuit into the power supply device within a shield case. Accordingly, it is possible to control the operation of the power supply device enclosed within the shield case from the control device outside of the shield case without having external noise affecting the power supply device. Moreover, based on commands from the control device, the power supply control device controls the battery control device and resistance control device, thus adjusting the current/voltage supplied to the outside from the power supply circuit of the power supply device and then, the startup/shutdown control device shuts off the supply of operating power, thereby eliminating noise generated by various functional blocks within the power supply device. Furthermore, the set states of the battery control device and resistance control device are maintained even after the operating power is shut off, so it is possible to continue the supply of battery power to the outside at the desired current/voltage settings at low noise.

6 Claims, 9 Drawing Sheets

BATTERY POWER SUPPLY APPARATUS

BACKGROUND OF THE INVENTION

1. Field of the Invention

This invention relates to a low-noise battery power supply apparatus suited to low-noise measurement systems or to the measurement of characteristics of electronic circuits such as ultra high-sensitivity sensor elements wherein AC power noise from the outside has a large effect on the operating characteristics and results of measurement.

2. Description of the Prior Art

Variable AC/DC voltage power supplies that rectify AC power to generate DC always contain roughly 0.1 microvolt of power supply noise, so they cannot be used as the variable AC/DC voltage power supplies for low-noise measurement systems or electronic circuits such as ultra high-sensitivity sensor elements (ultra-sensitive light or microwave sensors, or SQUID, SIS/SNS or other Josephson effect devices, etc.) wherein AC power noise from the outside has a large effect on the operating characteristics and results of measurement. To this end, batteries are conventionally used in the case of performing measurements on materials when AC power noise has a large effect on the operating characteristics and results of measurement in this manner, so in order to obtain the required current or voltage, it is necessary to connect batteries in series or vary the value of the resistance connected in series with the batteries, thereby obtaining a power supply suited to the purpose.

FIG. 9 shows the aforementioned conventional battery-powered circuit for applying current/voltage to a specimen. This battery power supply is enclosed within a shield case that shields out noise induced from outside, and at the time that the current or voltage applied to the sample 5 is adjusted, the variable resistor 2 or number of batteries 1 must be manually changed each time to construct a circuit, and moreover, an ammeter 3 or voltmeter 4 must be used to confirm manually the required current or voltage. In addition, the individual batteries are manually isolated and measured, and then recharged or replaced with new batteries to confirm the battery voltage that drops with use of the battery.

In this manner, when a conventional battery power supply is used as a low-noise- power supply, every time it is necessary to change the current or voltage, it is necessary to separate the battery power supply circuit from the measurement system and manually adjust it, making the work extremely complicated.

On the other hand, in the event that a simple function for automatically adjusting the current/voltage of the battery power supply (a function for automatically switching batteries or resistance values) is added, noise arising from the power supply circuits and the like for operating this automatic adjustment function become an obstacle, giving rise to the possibility of having large effects on the sample operating characteristics/measurement results. In addition, since the power supply circuit itself is enclosed within a shield case, it is necessary to provide functions for command and control or information collection with respect to the automatic adjustment function outside of the shield case, so control signal lines must be extended from the shield case, and there is a possibility that noise introduced via these signal lines will have a large effect on the sample operating characteristics/measurement results.

The present invention was proposed in light of the above. Its object is to provide a battery power supply apparatus wherein the adjustment and control of the current/voltage to the outside can be performed efficiently and also the introduction of noise at the time of supplying power to the outside can be suppressed as much as possible.

SUMMARY OF THE INVENTION

To attain the above object, the battery power supply apparatus according to the present invention comprises: power supply means, enclosed within a shield case that shields out noise induced from outside, that is able to make fine adjustments to the current/voltage output to the outside by means of a combination of a plurality of batteries and variable setting of resistance values, command and control means that performs command and control of said power supply means, and bidirectional transmission means that, by converting electrical signals sent out from said command and control means into optical signals or acoustic signals and transmitting same to the power supply means and also converting optical signals or acoustic signals sent out from the power supply means into electrical signals and transmitting same to the command and control means, is able to induce an electrically insulated state between the power supply means and command and control means and also suppress the introduction of noise into the power supply means within the shield case; wherein said power supply means comprises: startup/shutdown control means that receives the power required for operation from a battery, and upon receiving an optical signal based on a startup command from said command and control means, enables the supply of operating power to various functional blocks within the power supply means, and upon receiving a shutdown command from the command and control means, shuts off the supply of operating power to various functional blocks within the power supply means, battery control means whereby the number of a plurality of batteries connected in series can be selectively set, and the selectively set state can be maintained even after the operating power is shut off, resistance control means whereby the resistance connected to the power supply circuit consisting of batteries selected by the aforementioned battery control means can be variably set arbitrarily, and the variably set state can be maintained even after the operating power is shut off, power supply control means that, based on power supply control commands from said command and control means, performs the selective setting of batteries by said battery control means and the variable setting of the resistance value by said resistance control means, and thus controls the current/voltage supplied from the battery-based power supply circuit, wherein, after the current/voltage supplied to the outside from the power supply circuit of the power supply means is adjusted, it is possible to shut off the supply of operating power by the startup/shutdown control means and eliminate noise generated from the various functional blocks within the power supply means, thereby providing a low-noise battery power supply.

In addition, the aforementioned battery power supply apparatus comprises: a battery-based constant-current power supply, a battery control means and a switching means that is able to switch either a power supply circuit set by a resistance control means or a power supply circuit based on the aforementioned constant-current power supply to be the power supply circuit to the outside, wherein a minute current from the constant-current power supply is applied to both ends of a sample connected to the battery power supply apparatus, and the voltage between said both ends is measured to measure the resistance of the sample.

In addition, the aforementioned battery power supply apparatus is one wherein said switching means has a function for switching between connecting and disconnecting a measuring instrument that measures the current/voltage applied to the sample.

In addition, the aforementioned battery power supply apparatus comprises charging means for charging batteries within the power supply means that is automatically started upon receiving a supply of power from outside.

As described above, by means of the battery power supply apparatus according to the present invention, the power supply means that supplies power to the outside and the command and control means that performs command and control of said power supply means perform bidirectional communications by means of the bidirectional transmission means, and thus it is possible to prevent noise arising in the command and control means from reaching the power supply means and also, it is possible also to prevent the introduction of noise from the signal transmission path into the power supply means within the shield case. Accordingly, it is possible to perform control of the operation of the power supply means enclosed within the shield case from the command and control means outside of the shield case without having external noise affecting the power supply means. Moreover, based on commands from the command and control means, the power supply control means performs control of the battery control means and resistance control means, thus adjusting the current/voltage supplied to the outside from the power supply circuit of the power supply means and then, the startup/shutdown control means shuts off the supply of operating power, thereby eliminating noise generated by various functional blocks within the power supply means. Furthermore, the set states of the battery control means and resistance control means are maintained even after the operating power is shut off, so it is possible to continue the supply of battery power to the outside at the desired current/voltage settings at low noise.

Accordingly, the battery power supply apparatus according to the present invention can efficiently perform the control of adjustment of the current/voltage supplied to the outside and also, the introduction of noise at the time of power supply to the outside can be suppressed as much as possible, thus becoming a low-noise battery power supply apparatus suited to low-noise measurement systems or the measurement of characteristics of electronic circuits such as ultra high-sensitivity sensor elements wherein AC power noise from the outside has a large effect on the operating characteristics and results of measurement.

The above and other objects, features and advantages of the present invention will become apparent from the description given hereinbelow with reference to the accompanying drawings.

DESCRIPTION OF THE PREFERRED EMBODIMENTS

Figure 1:
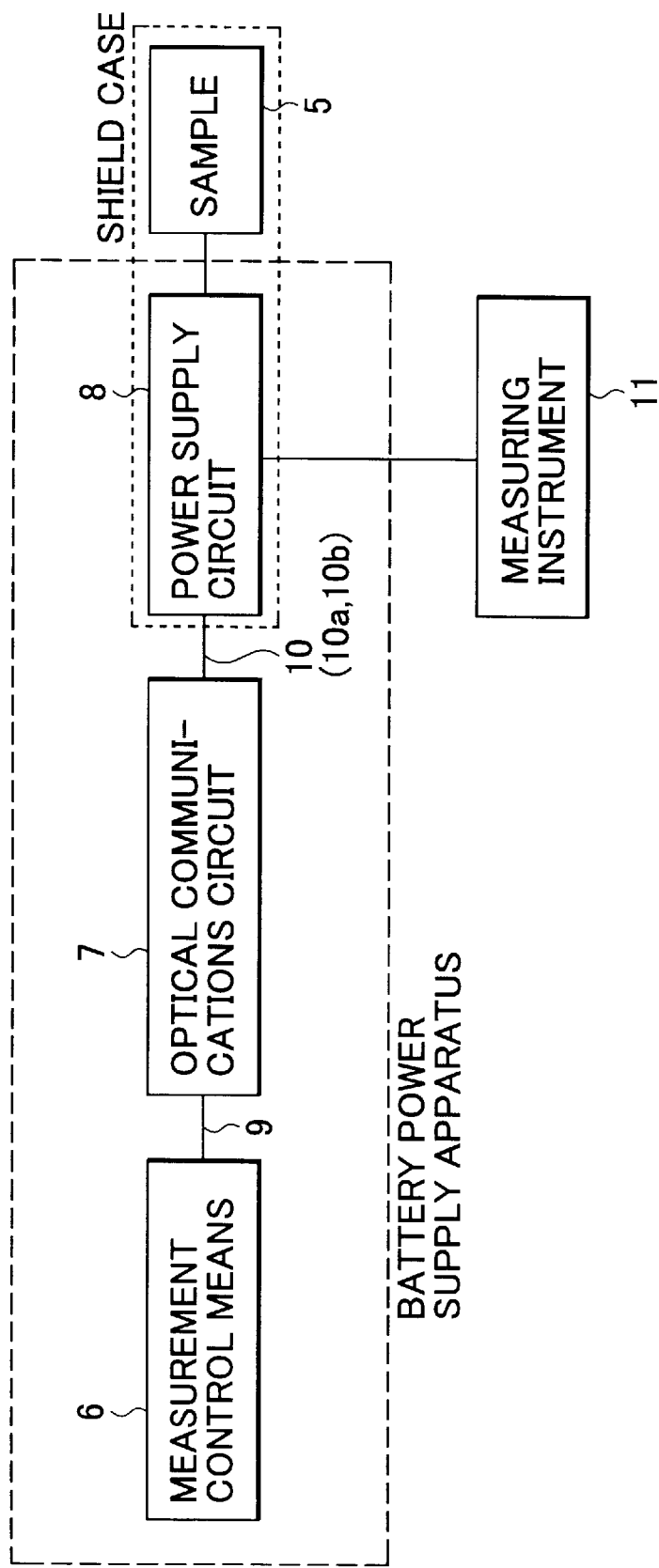
FIG. 1 is a schematic structural diagram of a battery power supply apparatus according to the present invention.

Here follows a detailed description of the embodiment of the present invention made with reference to the appended drawing. FIG. 1 shows the schematic structure in the case that the battery power supply apparatus according to the present invention used specially in the function of measuring samples. In FIG. 1, the battery power supply apparatus consists of a measurement control means 6 serving as the command and control means that performs overall command and control, a control signal line 9, optical communications circuit 7, optical communications line 10 and power supply circuit 8 serving as the power supply means that is able to make fine adjustments to the current/voltage output to the outside. In addition, the power supply circuit 8 and sample 5 are enclosed within a shield case, thereby suppressing the effects of outside noise as much as possible. Note that in this embodiment, the control signal line 9, optical communications circuit 7 and optical communications line 10 function mutually, so by forming an electrically insulated state between the power supply circuit 8 and measurement control means 6, they become a bidirectional transmission means that is able to prevent the introduction of noise into the power supply circuit 8 within the shield case.

The aforementioned measurement control means 6 may be implemented by running appropriate measurement control software in an electronic computer (personal computer, etc.), sending to the power supply circuit 8 commands for adjusting and controlling the current/voltage of the power supplied to the sample 5, and also sending even finer adjustment commands based on measurement information fed back from the power supply circuit 8. The control signal line 9 that connects this measurement control means 6 and optical communications circuit 7 is an electrical signal line by which parallel or serial mutual communication is possible. The optical communications line 10 that connects the optical communications circuit 7 and power supply circuit 8 is an optical communications line consisting of a pair of optical fibers, one for sending and one for receiving, by which mutual communication is possible. The optical communications circuit 7 converts electrical signals which are control signals sent from the measurement control means 6 into optical signals which are sent to the power supply circuit 8, and also converts optical signals received from the power supply circuit 8 into control signals which are sent to the measurement control means 6, thereby permitting signal conversion and mutual communication between the measurement control means 6 and power supply circuit 8. As will be described later, the power supply circuit 8 functions as a battery power supply that permits the supply of power to the sample 5 without the introduction of noise, where the control of changing the power supply current/voltage and the control of switching of connections to the sample 5 or a measuring instrument 11 or the like are performed by means of commands from the aforementioned measurement control means 6.

Figure 2:
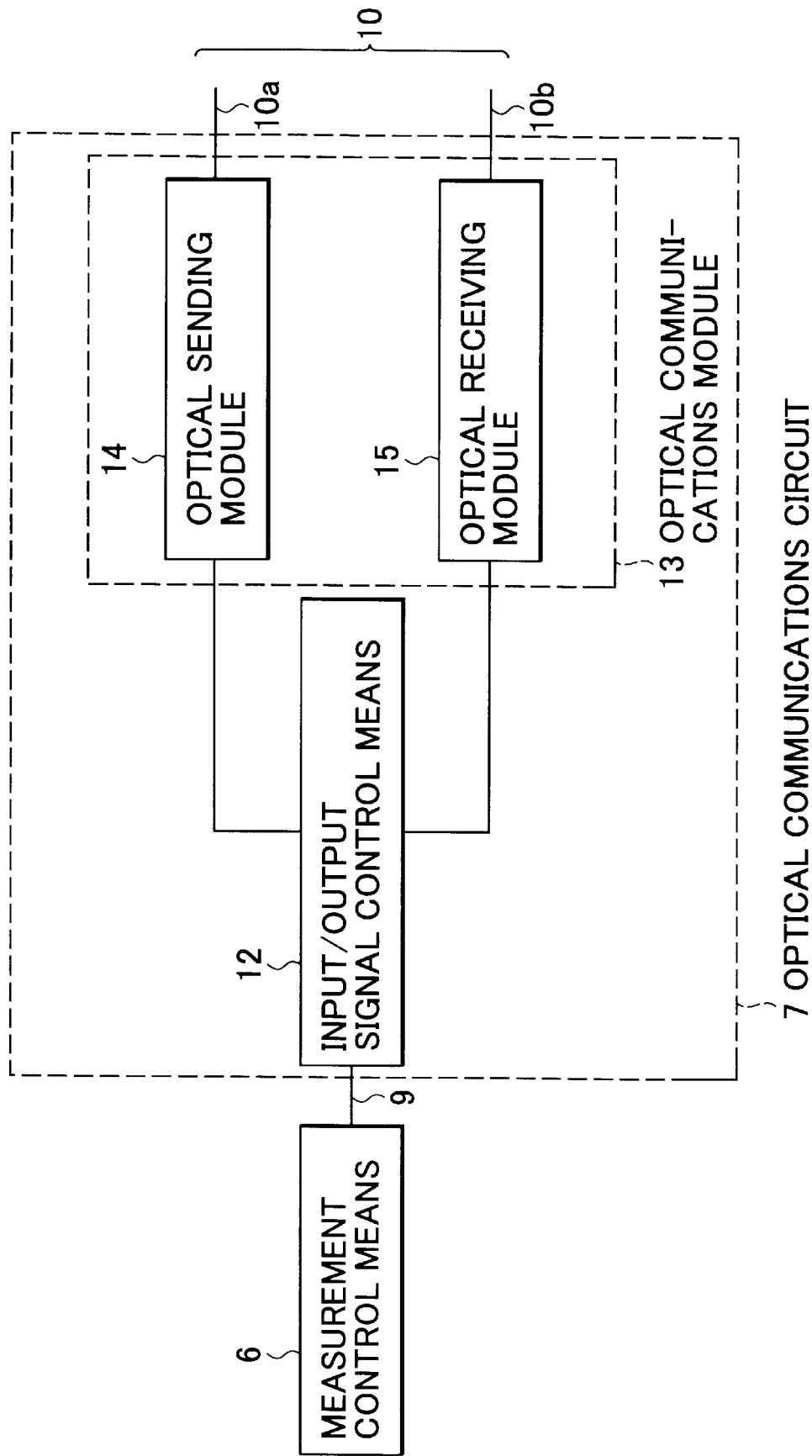
FIG. 2 is a schematic structural diagram of the optical communications circuit of the battery power supply apparatus of FIG. 1.

FIG. 2 shows the detailed structure of the aforementioned optical communications circuit 7. The optical communications circuit 7 consists of an input/output signal control means 12 and optical communications module 13 (consisting of an optical sending module 14 having electrical-optical conversion functions and an optical receiving module 15 having optical-electrical conversion functions). The input/output signal control means 12 converts control signals from the measurement control means 6 into serial signals, for example, and sends same to the optical sending module 14 where they are converted into optical signals of the desired intensity and the optical signals are sent to an optical communications line for sending 10a. On the other hand, when an optical signal is input to an optical communications line for receiving 10b, the optical receiving module 15 converts the optical signal to a serial signal which is sent to the input/output signal control means 12, and the input/output signal control means 12 which receives this signal converts the serial signal to control signals which are sent to the measurement control means 6. Note that in this embodiment, the power supply circuit 8 contained within the shield case and the optical communications circuit 7 are connected by optical fiber, thus creating an electrically insulated state between the power supply circuit 8 and measurement control means 6, thereby suppressing the introduction of noise into the power supply circuit 8 within the shield case, but a similar effect can be obtained by means of fiber-less optical communications or ultrasonic communications.

Figure 3:
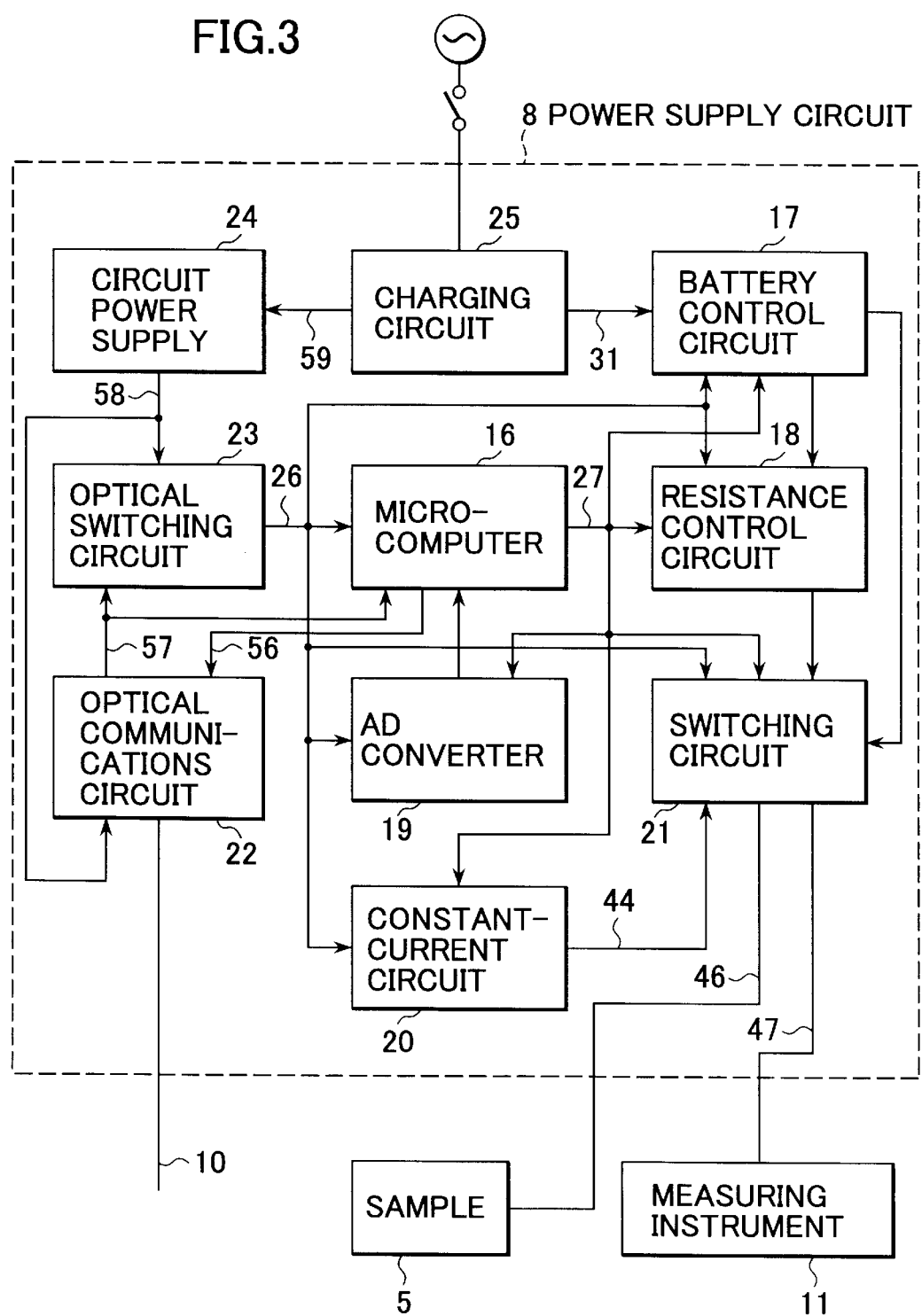
FIG. 3 is a schematic structural diagram of the power supply circuit of the battery power supply apparatus of FIG. 1.

FIG. 3 is a structural diagram of the power supply circuit 8. The power supply circuit 8 consists of a power supply control means 16, battery control circuit 17, resistance control circuit 18, AD converter 19, constant-current circuit 20, switching circuit 21, optical communications circuit 22, optical switching circuit 23, circuit power supply 24 and charging circuit 25.

When an optical signal is input to the power supply circuit 8 from the optical communications line 10 (optical communications line for sending 10a), the optical communications circuit 22 which receives this optical signal sends an electrical signal to the optical switching circuit 23, and the optical switching circuit 23 connects the power supply obtained from the circuit power supply 24 to a power supply line 26. Thereby, the various functional blocks within the power supply circuit 8 are activated, enabling power supply control or other operations. Note that a portion of the optical communications circuit 22 (the optical receiving module) and the optical switching circuit 23 are to be continuously supplied with power from the circuit power supply 24, so that they can perform the various operations accompanying the input of optical signals. In addition, if there is no input of optical signals from the optical communications line 10, and if a certain amount of time has elapsed since there is no input of electrical signals from the optical communications circuit 22, the optical switching circuit 23 shuts off the power supply line 26 and the power supply obtained from the circuit power supply 24, so the supply of power to the various functional blocks within the power supply circuit 8 is halted. To wit, in this embodiment, the optical communications circuit 22 and optical switching circuit 23 implement the functions of the "startup/shutdown control means that receives the power required for operation from a battery, and upon receiving an optical signal based on a startup command from said command and control means, enables the supply of operating power to various functional blocks within the power supply means, and upon receiving a shutdown command from the command and control means, shuts off the supply of operating power to various functional blocks within the power supply means."

When the supply of circuit power begins to be supplied to various blocks by means of the aforementioned optical switching circuit 23, the internal circuits of the power supply circuit 8 begin to operate. Upon beginning to operate, the power supply control means 16 monitors the optical communications circuit 22 and assumes the input wait state for control signals sent from the measurement control means 6. Moreover, when a control signal is input from the optical communications line 10, the power supply control means 16 outputs to the circuit line 27 a signal for performing control within the power supply circuit 8 that corresponds to the control signal, and upon receiving signals from said circuit line 27, the battery control circuit 17, resistance control circuit 18, AD converter 19, constant-current circuit 20 and switching circuit 21 perform operation within these circuits corresponding to the signals from the circuit line 27. In particular, based on power supply control commands from the measurement control means 6, the power supply control means 16 that controls. the adjustment of the current/voltage supplied from the power supply circuit 8 causes the selective setting of batteries by the battery control circuit 17 and the variable setting of the resistance value by the resistance control circuit 18, thereby enabling the supply of the desired current/voltage, so it assumes the functions of overall control regarding the supply of power to the outside.

Figure 4:
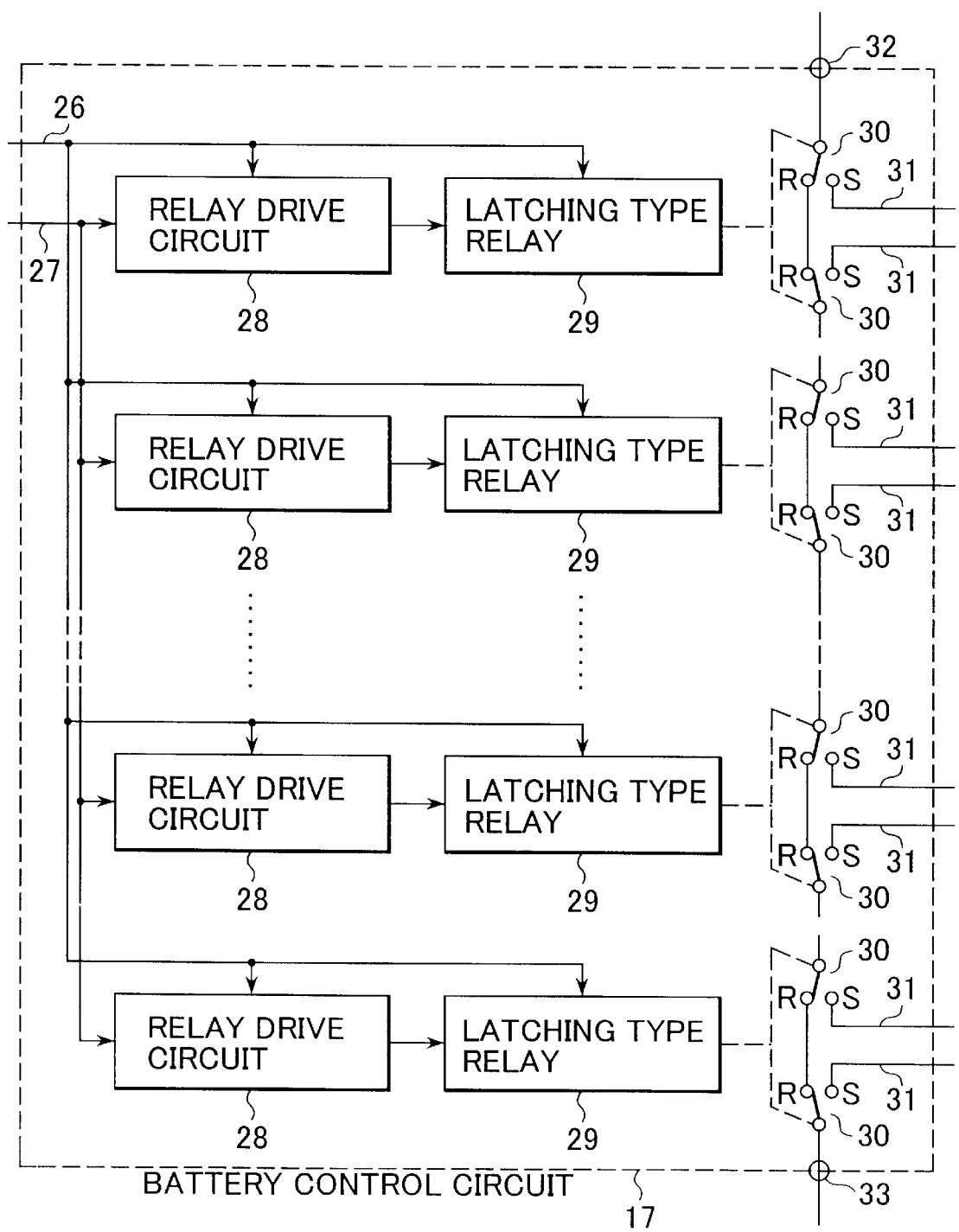
FIG. 4 is a schematic structural diagram of the battery control circuit of the power supply circuit of FIG. 3.

Here follows a description of the structure of the battery control circuit 17 that receives signals from the aforementioned power supply control means 16, with reference to FIG. 4. The battery control circuit 17 consists of a plurality of circuits combining a relay drive circuit 28 and a latching type relay 29, connected in series to form a circuit. In the battery control circuit 17, the relay drive circuits 28 and latching type relays 29 become able to operate when supplied with power from the power supply line 26, and can be controlled by signals from the power supply control means 16 input via the circuit line 27.

The aforementioned relay drive circuit 28 controls the operation of the latching type relay 29 by means of the set signals and reset signals of a circuit line 27. For example, when a set signal is input to the relay drive circuit 28, a relay contact 30 of the latching type relay 29 connected to said relay drive circuit 28 is connected to the set-side terminal S, but when a reset signal is input to the relay drive circuit 28, the relay contact 30 of the connected latching type relay 29 is connected to the reset-side terminal R.

Moreover, when the relay contact 30 is connected to the set terminal side, it is connected to a battery connection line 31 from the charging circuit 25, and the voltage between terminals of power output terminal 32 and power output terminal 33 is raised. When the relay contact 30 is connected to the reset side, the set-side terminal S connected to the battery connection line 31 is released and the reset-side terminal is shorted. To wit, the voltage between the power output terminal 32 and power output terminal 33 can be controlled by the combination of set and reset settings of the various relay contacts 30 based on the latching type relays 29. Note that the power output terminal 32 is connected to the resistance control circuit 18 of FIG. 3 and the power output terminal 33 is connected to the switching circuit 21 of FIG. 3.

In addition, even if the supply of power from the power supply line 26 is shut off, the latching type relay 29 holds the state in which it is set, so the voltage between the power output terminal 32 and power output terminal 33 can be held. To wit, in this embodiment, the battery control circuit 17 that performs the selective setting of batteries that are connected in series by the combined circuit of relay drive circuit 28 and latching type relay 29 functions as the "battery control means whereby the number of a plurality of batteries connected in series can be selectively set, and the selectively set state can be maintained even after the operating power is shut off." Note that in order to hold the setting state even if the supply of power is shut off, a rotary solenoid switch or other known technique may be used appropriately.

Figure 5:
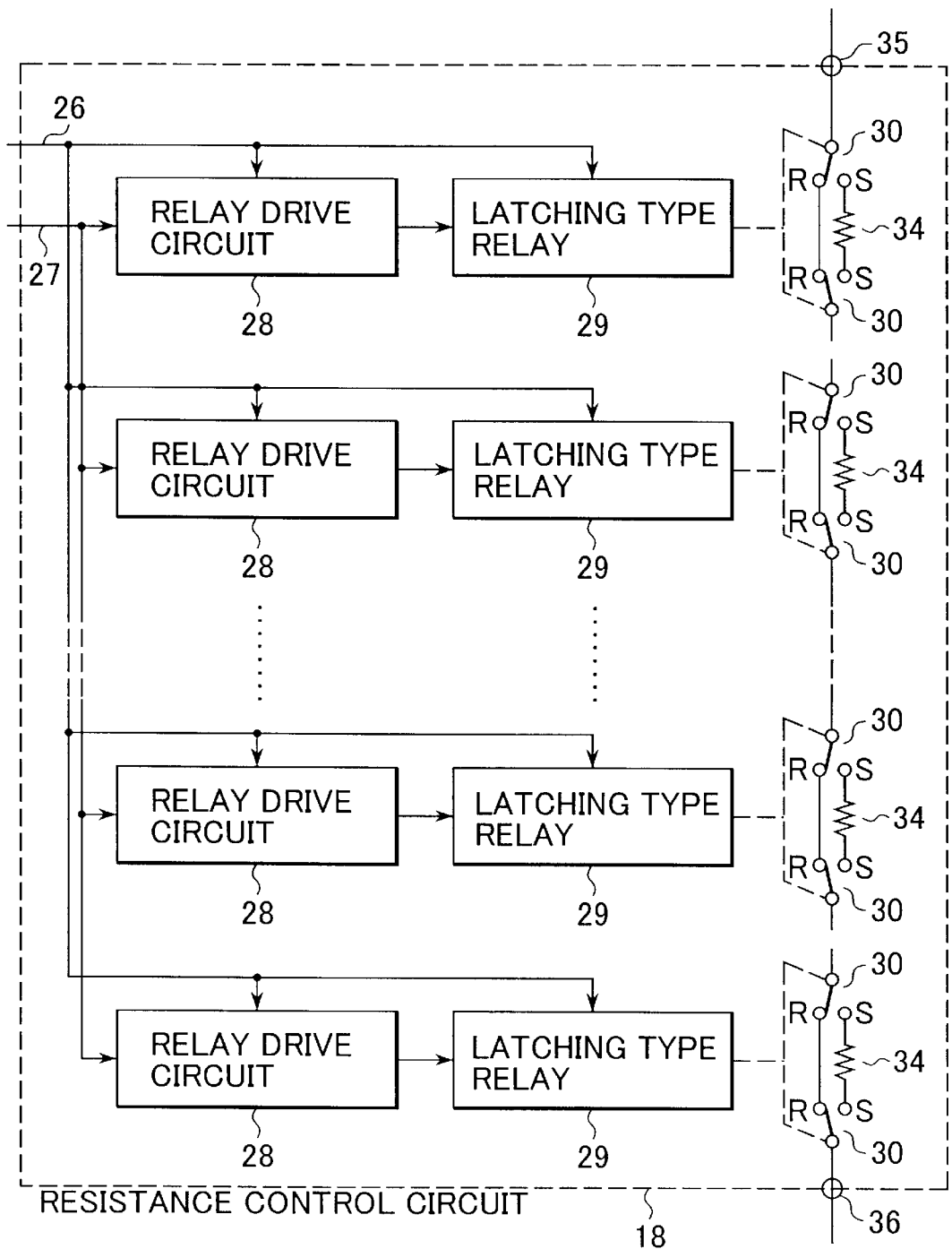
FIG. 5 is a schematic structural diagram of the resistance control circuit of the power supply circuit of FIG. 3.

Here follows a description of the structure of the resistance control circuit 18 made with reference to FIG. 5. The resistance control circuit 18 consists of a plurality of circuits combining a relay drive circuit 28, a latching type relay 29 and a resistor 34, connected in series to form a circuit. The resistance control circuit 18 is able to operate when supplied with power from the power supply line 26, and can be controlled by signals input from the power supply control means 16 via the circuit line 27.

This relay drive circuit 28 controls the operation of the latching type relay 29 by means of the set signals and reset signals of a circuit line 27. For example, when a set signal is input to the relay drive circuit 28, a relay contact 30 of the latching type relay 29 connected to said relay drive circuit 28 is connected to the set-side terminal S, but when a reset signal is input to the relay drive circuit 28, the relay contact 30 of the connected latching type relay 29 is connected to the reset-side terminal R.

Moreover, when the relay contact 30 is connected to the set terminal side, a resistor 34 is inserted in series between terminals of resistor output terminal 35 and resistor output terminal 36 and the resistance value is raised. When the relay contact 30 is connected to the reset side, the resistor 34, inserted in series between terminals of resistor output terminal 35 and resistor output terminal 36 is shorted and the resistance value is lowered. To wit, the resistance value between the resistor output terminal 35 and resistor output terminal 36 can be controlled by the combination of set and reset settings of the various relay contacts 30 based on the latching type relays 29. Note that the resistor output terminal 35 is connected to the power output terminal 32 of the battery control circuit 17 of FIG. 4 and the resistor output terminal 36 is connected to the switching circuit 21 of FIG. 3.

In addition, even if the supply of power from the power supply line 26 is shut off, the latching type relay 29 holds the state in which it is set, so the resistance value between the resistor output terminal 35 and resistor output terminal 36 can be held. To wit, in this embodiment, the resistance control circuit 18 that performs the setting of the number of resistors 34 inserted into the combined circuit of relay drive circuit 28 and latching type relay 29 functions as the "resistance control means whereby the resistance connected to the power supply circuit consisting of batteries selected by the aforementioned battery control means can be variably set arbitrarily, and the variably set state can be maintained even after the operating power is shut off." Note that in order to hold the setting state even if the supply of power is shut off, a rotary solenoid switch or other known technique may be used appropriately. In addition, if a structure is adopted wherein the variable resistor is controlled by a motor, the resistance value at the time that the motor is halted is held, so the resistance control circuit 18 is able to hold the resistance value between the resistor output terminal 35 and resistor output terminal 36 even if the supply of power from the power supply line 26 is shut off.

Figure 6:
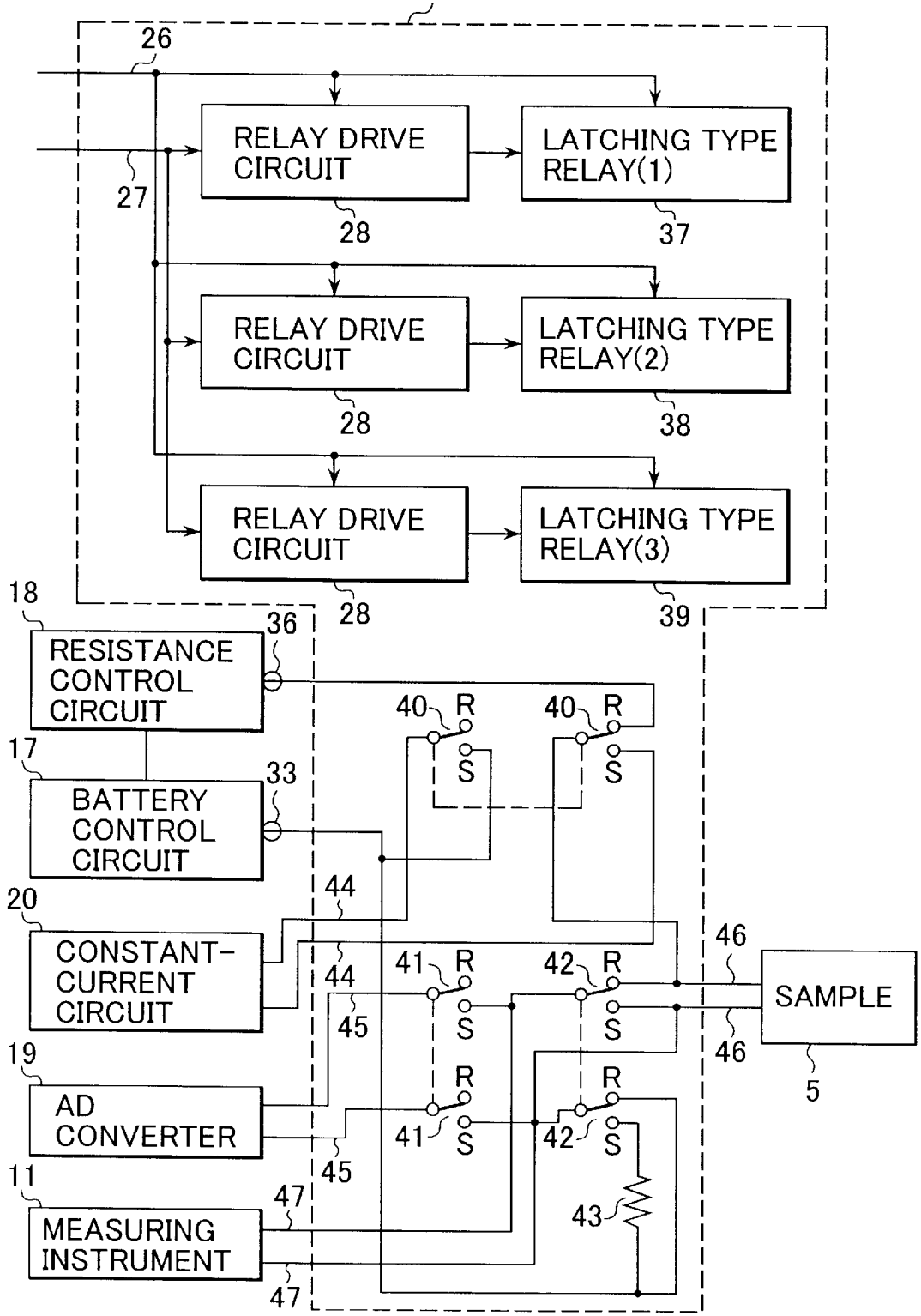
FIG. 6 is a schematic structural diagram of the switching circuit of the power supply circuit of FIG. 3.

Next, we shall describe the structure of the switching circuit 21 with reference to FIG. 6. The switching circuit 21 may consist, for example, of three sets of circuits consisting of a relay drive circuit and latching type relay (e.g., three relay drive circuits 28 and latching type relay (1) 37, latching type relay (2) 38 and latching type relay (3) 39 and a resistor used to measure current 43. When supplied with power via the power supply line 26, the switching circuit 21 becomes able to operate and is controlled by the signals input from the power supply control means 16 via the circuit line 27. The relay drive circuit 28 controls the operation of the latching type relay (1) 37, latching type relay (2) 38 and latching type relay (3) 39 by the set signals and reset signals of the circuit line 27. Note that the switching circuit 21 in this embodiment functions as a switching means having the "switching function that is able to switch either a power supply circuit set by a battery control means and resistance control means or a power supply circuit based on a constant-current power supply to be the power supply circuit to the outside" and the "function for switching between connecting and disconnecting a measuring instrument that measures the current/voltage applied to the sample."

The relay contact 40 of latching type relay (1) 37 switches the power supply applied to the sample 5 (either the power that depends on the set state of the battery control circuit 17 and resistance control circuit 18 or the power from the low-current circuit 20), and when the relay contact 40 of the latching type relay (1) 37 is connected to the reset-side terminal R, the voltage output from the resistor output terminal 35 of the resistance control circuit 18 is applied to the sample 5 via measurement lines 46, but when the relay contact 40 of the latching type relay (1) 37 is connected to the set-side terminal S, the output of the constant-current circuit 20 used in measuring the resistance of the sample 5 is applied from constant-current supply lines 44.

The relay contact 41 of latching type relay (2) 38 switches between connecting and disconnecting the AD converter connection lines 45 of the AD converter 19, and when the relay contact 41 of the latching type relay (2) 38 is connected to the reset-side terminal R, the AD converter connection lines 45 of the AD converter 19 are disconnected from the measurement location, but when the relay contact 41 of the latching type relay (2) 38 is connected to the set-side terminal S, the AD converter connection lines 45 of the AD converter 19 are connected to the measurement location.

The relay contact 42 of latching type relay (3) 39 switches between the case of measuring the resistance and voltage of the sample 5 and the case of measuring the current. When the relay contact 42 of the latching type relay (3) 39 is connected to the reset-side terminal R, the resistance and voltage of the sample 5 are measured, so measurement lines 46 connected to both terminals of the sample 5 are connected via measuring instrument connection lines 47 and relay contact 41 to the AD converter connection lines 45 of AD converter 19. When the relay contact 42 of the latching type relay (3) 39 is connected to the set-side terminal S, the current of the sample 5 is measured, so both terminals of the resistor used to measure current 43 are connected via the measuring instrument connection lines 47 of the measuring instrument and relay contact 41 to the AD converter connection lines 45 of the AD converter 19.

In addition, the latching type relay (1) 37, latching type relay (2) 38 and latching type relay (3) 39 are able to hold the circuit setting state as set even if the power of the power supply line 26 is shut off. Note that in order to hold the setting state even if the supply of power is shut off, a rotary solenoid switch or other known technique may be used appropriately.

Figure 7:
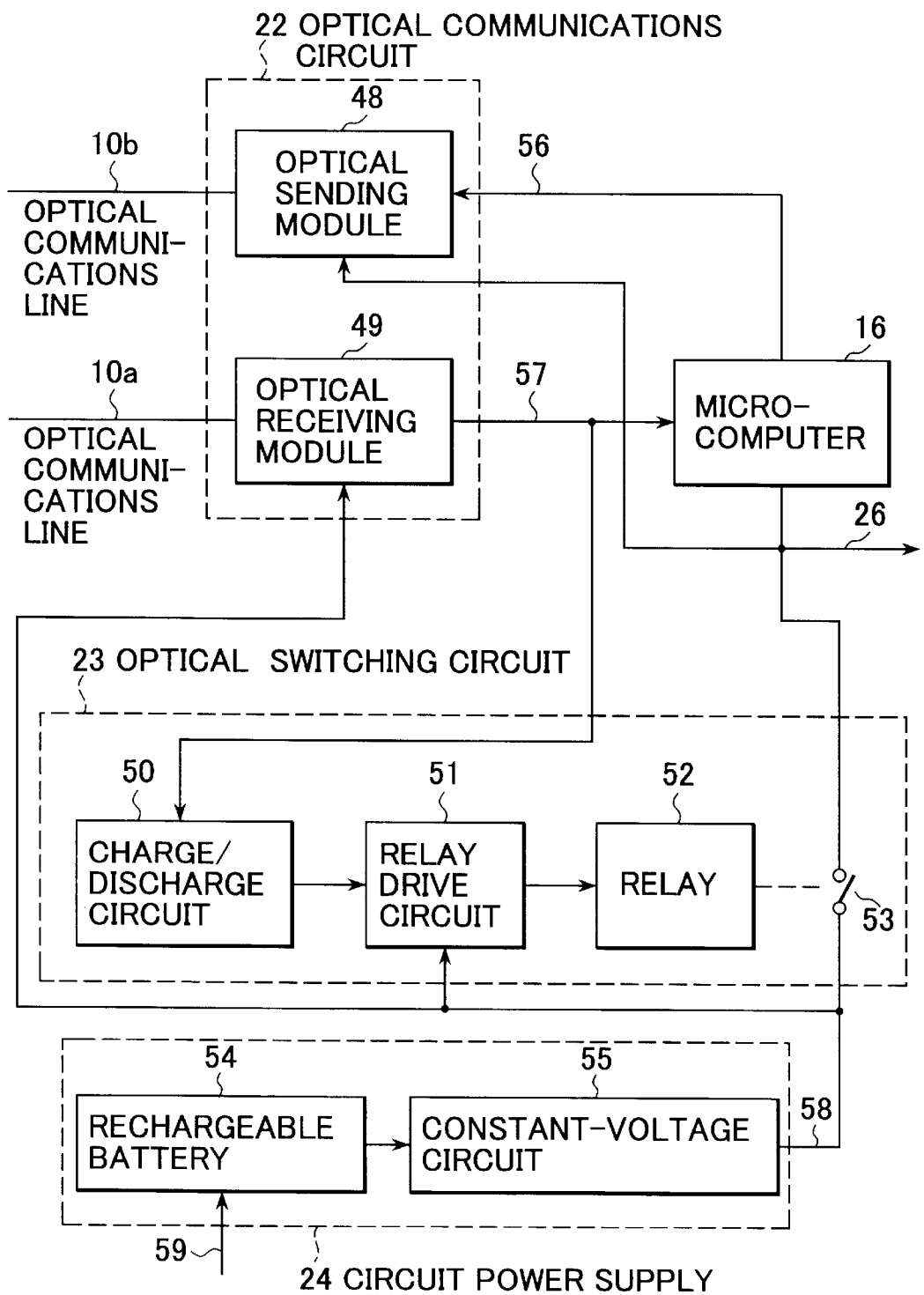
FIG. 7 is a schematic structural diagram of the optical communications circuit, optical switching circuit and circuit power supply of the power supply circuit of FIG. 3.

Next, we shall describe the structure of the optical communications circuit 22, optical switching circuit 23 and circuit power supply 24 with reference to FIG. 7. The optical communications circuit 22 consists of an optical sending module 48 and an optical receiving module 49. The optical switching circuit 23 consists of a charge/discharge circuit 50, relay drive circuit 51 and relay 52. The circuit power supply 24 consists of a rechargeable battery 54 and constant-voltage circuit 55. The optical receiving module 49 of the circuit power supply 24 and optical communications circuit 22 and the relay drive circuit 51 of the optical switching circuit 23 operate constantly while the power supply is on. In addition, the optical sending module 48 of the optical communications circuit 22 operates when power is supplied from the power supply line 26.

When there is input of an optical signal from the optical communications line 10 (the optical communications line for sending 10a), the optical receiving module 49 of the optical communications circuit 22 outputs a Hi level signal to a control signal relay line 57. Moreover, when the aforementioned control signal relay line 57 assumes the Hi level, the charge/discharge circuit 50 of the optical switching circuit 23 begins charging, and the relay drive circuit 51 of the optical switching circuit 23 drives relay 52 when the charging voltage of the charge/discharge circuit 50 reaches a value set near the Hi level. Thereby, the relay contact 53 closes so that the output line 58 of the circuit power supply 24 is connected to the power supply line 26, and thus power is supplied via the power supply line 26 to the various functional blocks of the power supply circuit 8.

On the other hand, when there is no more input of an optical signal from the optical communications line 10 (the optical communications line for sending 10a), the optical receiving module 49 of the optical communications circuit 22 outputs a Low level signal to the control signal relay line 57. Moreover, when the aforementioned control signal relay line 57 assumes the Low level, the charge/discharge circuit 50 of the optical switching circuit 23 begins a slow discharge, and the relay drive circuit 51 of the optical switching circuit 23 resets relay 52 when the charging voltage reaches a value set near the Low level. Thereby, the relay contact 53 opens so that the output line 58 of the circuit power supply 24 is disconnected from the power supply line 26, and thus the supply of power from the power supply line 26 to the various functional blocks is shut off.

In addition, the control signals sent from the optical communications line 10 (the optical communications line for sending 10a) are converted into electrical signals by the optical receiving module 49 of the optical communications circuit 22, and sent to the power supply control means 16, and conversely, the control signals sent from the power supply control means 16 are converted to optical signals by the optical sending module 48 of the optical communications circuit 22, and sent to the optical communications line 10 (the optical communications line for receiving 10b), so mutual communication between the measurement control means 6 and power supply control means 16 can be performed.

The circuit power supply 24 connects the output of the rechargeable battery 54 to the constant-voltage circuit 55, so a stable voltage from the constant-voltage circuit 55 is output to the output line 58. The rechargeable battery 54 is charged by power supplied from the charging circuit 25 via a charging line 59.

Figure 8:
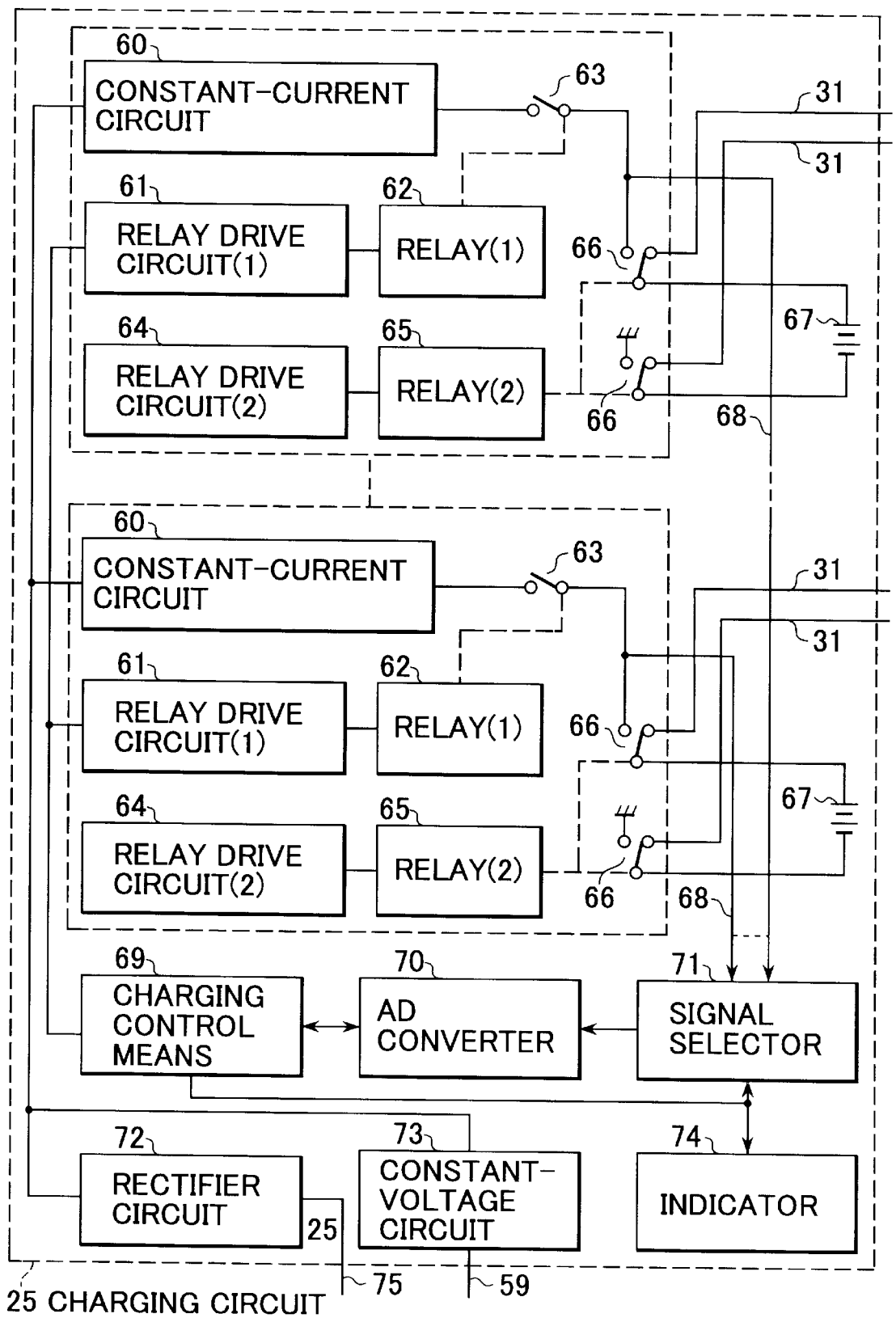
FIG. 8 is a functional block diagram of the charging circuit of the power supply circuit of FIG. 3.
Figure 9:
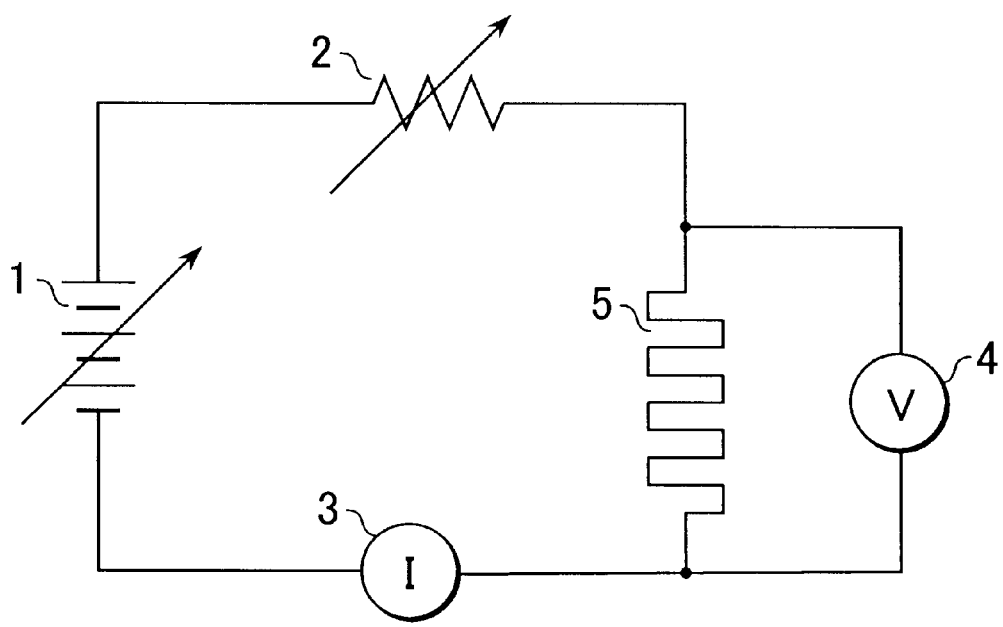
FIG. 9 is a schematic diagram of a conventional manual battery power supply circuit of the power supply circuit of FIG. 3.

Next, we shall describe the structure of the charging circuit 25 with reference to FIG. 8. The charging circuit 25 consists of a plurality of circuits combining a constant-current circuit 60, relay drive circuit (1) 61, relay (1) 62, relay drive circuit (2) 64, relay (2) 65 and rechargeable battery 67, along with a charging control means 69, AD converter 70, signal selector 71, rectifier circuit 72, constant-voltage circuit 73 and indicator 74.

When an AC power supply is connected via an AC power line 75 to the charging circuit 25, this alternating current is supplied to the rectifier circuit 72 and the DC output rectified by the rectifier circuit 72 is provided as input to the various constant-current circuits 60 and the constant-voltage circuit 73. When the constant-voltage circuit 73 supplies power to the various circuits within the charging circuit 25, the various circuits operate so the charging of the charging circuit 25 is performed. In addition, power is supplied from the constant-voltage circuit 73 to the circuit power supply 24 via the charging line 59, so the charging of the rechargeable battery 54 is performed. Note that the power supplied to the charging circuit 25 is not limited to alternating current, but rather the operation as described above may also be performed by means of direct current.

When power is supplied, the relay drive circuit (2) 64 drives relay (2) 65 and the rechargeable battery 67 connected to relay contact 66 is switched from the battery connection line 31 side to the relay contact 63 side of relay (1) 62, and the voltage of each rechargeable battery 67 is connected via a line 68 to the signal selector 71. Moreover, when the charging control means 69 begins operating, the voltage of the each rechargeable battery 67 is measured by the AD converter 70 after switching with the signal selector 71, and if the voltage of the rechargeable battery 67 is less than the charging start voltage, the battery is assumed to be defective, and the charging monitor display lamp of the indicator 74 flashes to indicate this. In addition, for a rechargeable battery 67 above the charging start voltage, the charging control means 69 drives the relay drive circuit (1) 61 to actuate the relay (1) 62 and close the relay contact 63, and the rechargeable battery 67 is connected to the constant-current circuit 60 to begin charging, and the charging monitor display lamp of the indicator 74 lights to indicate this. Once the charging of a rechargeable battery 67 starts, the charging control means 69 monitors the voltage of the rechargeable battery 67, and when a stipulated charging end voltage is reached, the relay drive circuit (1) 61 is halted, the relay (1) 62 is opened and the rechargeable battery 67 is disconnected from the constant-current circuit 60 to end charging, and the charging monitor display lamp of the indicator 74 goes out. Thus, all of the rechargeable batteries 67 within the charging circuit 25 can be automatically charged.

To wit the charging circuit 25 in this example functions as the "charging means for charging batteries within the power supply means that is automatically started upon receiving a supply of power from outside." Note that when the charging circuit 25 is disconnected from the AC power supply and the alternating current is not supplied from the AC power line 75, each of the circuits is halted, and the relay contact 66 is reset, each of the rechargeable batteries 67 is connected to the battery connection line 31 side.

Next, we shall describe the flow of measurement using the battery power supply apparatus according to this embodiment and the operation of the various blocks.

The measurement control means 6 controls the power supply circuit 8 by the input/output of control signals via the control signal line 9 and optical communications line 10, and when the measurement control means 6 controls the power supply circuit 8. When a control signal consisting of a control code for turning on power to the power supply circuit 8 is output to the control signal line 9, the power is automatically turned on to the power supply circuit 8, allowing various control codes to be accepted, and operations corresponding to the control codes output from the measurement control means 6 are performed by the power supply circuit 8.

When the measurement control means 6 measures the resistance of the sample 5, the measurement control means 6 turns on the power to the power supply circuit 8, controls the switching circuit 21 and connects the constant-current circuit 20 and AD converter 19 to the sample 5. Next, the measurement control means 6 sends control codes for the current output by the constant-current circuit 20 and the input voltage range setting of the AD converter 19, sends the voltage at both ends of the sample 5 as the voltage value read by the AD converter 19, and calculates the sample resistance from this voltage value. In the event that the calculated resistance value falls outside a set measurement range, the measurement control means 6 sends a control code that switches the input voltage range setting of the AD converter 19 of the switching circuit 21 and the current setting of the constant-current circuit 20, re-reads the voltage between sample terminals and the process of calculating the sample resistance is repeated until the value thus obtained comes within the measurement range. When the sample resistance value falls within the measurement range, the calculation then terminates and then a control code that disconnects the sample from the AD converter 19 and constant-current circuit 20 is sent and the process terminates.

When the measurement control means 6 measures the voltage of the sample 5, the output voltage of the battery control circuit 17 and the resistance value of the resistance control circuit 18 are calculated from the voltage applied to the sample 5 and the sample resistance obtained in resistance measurement. Next, the measurement control means 6 sends to the control signal line control codes that set the calculated voltage output of the battery control circuit 17 and the resistance value of the resistance control circuit 18, controlling the switching circuit 21 to connect the battery control circuit 17, resistance control circuit 18 and AD converter 19 to the sample 5. Note that error is included within the electromotive force and resistance of each of the rechargeable batteries 67 in the charging circuit 25 of the power supply circuit 8, so the measurement control means 6 reads in the voltage between sample terminals, compares that voltage value against a set applied voltage value, and if different from the set voltage, sends new control codes in order to make a fine adjustment to the setpoint of the resistance control circuit 18, and then the fine adjustment is repeated until the set applied voltage is reached.

When the setting of the applied voltage is complete, the measurement control means 6 outputs to the power supply circuit 8 both control codes that disconnect the AD converter 19 and control codes that connect to the measuring instrument 11, thereby changing to a circuit that performs voltage measurement. Then, the measurement control means 6 shuts off power to the power supply circuit 8, and outputs control codes that halt the internal circuits. Thereby, the power supply circuit 8 is automatically halted and assumes the control code input wait state, thus halting noise generated from the internal circuits. Voltage measurement is performed in this state using the measuring instrument 11.

When the measurement control means 6 measures the current of the sample 5, the output voltage of the battery control circuit 17 and the resistance value of the resistance control circuit 18 are calculated from the resistance the current applied to the sample 5 and the sample resistance obtained by measuring resistance. The measurement control means 6 sends control codes that set the calculated output voltage of the battery control circuit 17 and resistance value of the resistance control circuit 18, and controls the switching circuit 21 so that the resistance control circuit 18 is connected to one terminal of the sample 5 and the resistor used to measure current 43 is connected to the other terminal, thereby switching the connections so that the resistor used to measure current 43 is inserted between the sample 5 and battery control circuit 17. At this time, the AD converter 19 is connected to both ends of the resistor used to measure current 43 and the current flowing through the sample 5 is read in as the voltage value. Note that error is included within the electromotive force and resistance of the rechargeable batteries 67 in the charging circuit 25 of the power supply circuit 8, so the measurement control means 6 reads in the voltage between terminals of the resistor used to measure current 43, compares that voltage value against a set applied voltage value, and if different from the set current, sends new control codes in order to perform a fine adjustment of the setpoint of the resistance control circuit 18, and then the fine adjustment is repeated until the set applied current is reached.

When the setting of the applied current is complete, the measurement control means 6 outputs to the power supply circuit 8 control codes that disconnect the AD converter 19 and control codes that connect to the measuring instrument 11, thereby changing to a circuit that makes current measurement. Then, the measurement control means 6 shuts off power to the power supply circuit 8, and outputs control codes that halt the internal circuits. Thereby, the power supply circuit 8 is automatically halted and assumes the control code input wait state, thus halting noise generated from the internal circuits. Current measurement is performed in this state using the measuring instrument As described above, with the battery power supply apparatus according to this embodiment, the measurement control means 6 and the power supply control means 16 within the power supply circuit 8 exchange control signals via an optical fiber, so the measurement control means 6 constituted as a computer with a large amount of power supply noise can be electrically insulated from the power supply circuit 8. In addition, the noise generated from the internal circuits (power supply control means 16 constituted as a microcomputer, charging control means 69 within the charging circuit 25, etc.) of the power supply circuit 8 can be eliminated by performing measurement in the state with the power shut off to the circuits that generate noise. Moreover, the battery control circuit 17 and resistance control circuit 18 can maintain the power supply state prior to when the power is shut off, so this apparatus is suited to low-noise measurement systems and the measurement of characteristics of ultra high-sensitivity sensor elements.

Moreover, with the battery power supply apparatus according to this embodiment, when AC power is connected to the charging circuit 25 of the power supply circuit 8, the charging control means 69 of the charging circuit 25 automatically monitors the voltage of each of the rechargeable batteries 67, and if the battery voltage is above the charging start voltage, the rechargeable battery 67 is connected to the constant-current circuit 60 and charging is started. If the battery voltage is less than the charging start voltage and the battery is assumed to be defective, this is indicated by the indicator 74. To wit, the rechargeable batteries 67 can be automatically charged, and also, the selection of rechargeable batteries 67 that have a high probability of being defective can be automatically performed, so this is extremely convenient for the user.

As described above, with the battery power supply apparatus according to the present invention, the power supply means that supplies power to the outside and the command and control means that performs command and control of said power supply means perform bidirectional communication by means of a bidirectional transmission means, and it is thus possible to prevent noise arising in the command and control means from reaching the power supply means and also, it is possible also to prevent the introduction of noise from the signal transmission path into the power supply means within the shield case. Accordingly, it is possible to perform control of the operation of the power supply means enclosed within the shield case from the command and control means outside of the shield case without having external noise affecting the power supply means. Moreover, based on commands from the command and control means, the power supply control means performs control of the battery control means and resistance control means, thus adjusting the current/voltage supplied to the outside from the power supply circuit of the power supply means and then, the startup/shutdown control means shuts off the supply of operating power, thereby eliminating noise generated by various functional blocks within the power supply means. Furthermore, the set states of the battery control means and resistance control means are maintained even after the operating power is shut off, so it is possible to continue the supply of battery power to the outside at the desired current/voltage settings at low noise.

Accordingly, the battery power supply apparatus according to the present invention can efficiently perform the control of adjustment of the current/voltage supplied to the outside and also, the introduction of noise, at the time of power supply to the outside, can be suppressed as much as possible, thus becoming a low-noise battery power supply apparatus suited to low-noise measurement systems or the measurement of characteristics of electronic circuits such as ultra high-sensitivity sensor elements wherein AC power noise from the outside has a large effect on the operating characteristics and results of measurement.

In addition, with the aforementioned battery power supply apparatus, the measurement of the resistance of a measurement sample can be performed easily by using the switching means to switch the power supply circuits that supply power to the measurement sample.

Moreover, with the aforementioned battery power supply apparatus, the connection and disconnection of a measuring instrument can be performed easily with the switching means.

In addition, with this battery power supply apparatus, if power is supplied to the charging means from outside, this charging means can automatically charge batteries within the power supply means.

What is claimed is:

1. A battery power supply apparatus comprising: power supply means, enclosed within a shield case that shields out noise induced from outside, that is able to make fine adjustments to the current/voltage output to the outside by means of a combination of a plurality of batteries and variable setting of resistance values, command and control means that performs command and control of said power supply means, and bidirectional transmission means that, by converting electrical signals sent out from said command and control means into optical signals or acoustic signals and transmitting the same to the power supply means and also converting optical signals or acoustic signals sent out from the power supply means into electrical signals and transmitting the same to the command and control means, is able to induce an electrically insulated state between the power supply means and command and control means and also suppress the introduction of noise into the power supply means within the shield case, said power supply means comprising:

startup/shutdown control means that receives the power required for operation from a battery, and upon receiving an optical signal based on a startup command from said command and control means, enables the supply of operating power to various functional blocks within the power supply means, and upon receiving a shutdown command from the command and control means, shuts off the supply of operating power to various functional blocks within the power supply means;

battery control means whereby the number of a plurality of batteries connected in series can be selectively set, and the selectively set state can be maintained even after the operating power is shut off;

resistance control means whereby the resistance connected to the power supply circuit consisting of batteries selected by the aforementioned battery control means can be variably set arbitrarily, and the variably set state can be maintained even after the operating power is shut off;

power supply control means that, based on power supply control commands from said command and control means, performs the selective setting of batteries by said battery control means and the variable setting of the resistance value by said resistance control means, and thus controls the current/voltage supplied from the battery-based power supply circuit;

wherein, after the current/voltage supplied to the outside from the power supply circuit of the power supply means is adjusted, it is possible to shut off the supply of operating power by the startup/shutdown control means and eliminate noise generated from the various functional blocks within the power supply means, thereby providing a low-noise battery power supply.

2. The battery power supply apparatus according to claim 1, further comprising: a battery-based constant-current power supply, a battery control means and a switching means that is able to switch either a power supply circuit set by a resistance control means or a power supply circuit based on the aforementioned constant-current power supply to be the power supply circuit to the outside, wherein a minute current from the constant-current power supply is applied to both ends of a sample connected to the battery power supply apparatus, and the voltage between said both ends is measured to measure the resistance of the sample.

3. The battery power supply apparatus according to claim 2, wherein said switching means has a function for switching between connecting and disconnecting a measuring instrument that measures the current/voltage applied to the sample.

4. The battery power supply apparatus according to claim 1, further comprising charging means for charging batteries within the power supply means that is automatically started upon receiving a supply of power from outside.

5. The battery power supply apparatus according to claim 2, further comprising charging means for charging batteries within the power supply means that is automatically started upon receiving a supply of power from outside.

6. The battery power supply apparatus according to claim 3, further comprising charging means for charging batteries within the power supply means that is automatically started upon receiving a supply of power from outside.

* * * * *